US009835946B2

(12) United States Patent
Li et al.

(10) Patent No.: US 9,835,946 B2
(45) Date of Patent: Dec. 5, 2017

(54) COMPOSITE WHITE PIGMENT, PHOTORESIST MATERIAL COMPRISING THE PIGMENT AND USE THEREOF

(71) Applicants: BOE Technology Group Co., Ltd., Beijing (CN); Hefei Xinsheng Optoelectronics Technology Co., Ltd., Anhui (CN)

(72) Inventors: Jun Li, Beijing (CN); Yang Liu, Beijing (CN); Lingyan Wu, Beijing (CN); Lei Zhang, Beijing (CN); Ming Hu, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/078,571

(22) Filed: Mar. 23, 2016

(65) Prior Publication Data

US 2017/0010533 A1    Jan. 12, 2017

(30) Foreign Application Priority Data

Jul. 7, 2015    (CN) .......................... 2015 1 0397770

(51) Int. Cl.
*G03F 7/105*    (2006.01)
*G03F 7/004*    (2006.01)

(52) U.S. Cl.
CPC .............. *G03F 7/105* (2013.01); *G03F 7/004* (2013.01)

(58) Field of Classification Search
None
See application file for complete search history.

(56) References Cited

U.S. PATENT DOCUMENTS

| | | | | |
|---|---|---|---|---|
| 6,623,555 | B1 * | 9/2003 | Haverinen | A61K 8/19 106/464 |
| 2003/0113640 | A1 * | 6/2003 | Sabnis | G03F 7/0007 430/25 |
| 2013/0175479 | A1 * | 7/2013 | Du | G02F 1/167 252/500 |
| 2013/0258439 | A1 * | 10/2013 | Naijo | G02F 1/155 359/267 |

* cited by examiner

*Primary Examiner* — Sin Lee
(74) *Attorney, Agent, or Firm* — Banner & Witcoff, Ltd.

(57) ABSTRACT

Disclosed are a composite white pigment and a photoresist material. The composite white pigment includes particles, each of the particles includes an inner core including a non-white pigment and an outer layer including a white pigment and coating the inner core. The photoresist material includes the following components: 5 to 15 parts by weight of a photosensitizing agent, 5 to 15 parts by weight of a dispersant, 50 to 80 parts by weight of a solvent, and 5 to 15 parts by weight of the composite white pigment.

10 Claims, 1 Drawing Sheet

COMPOSITE WHITE PIGMENT, PHOTORESIST MATERIAL COMPRISING THE PIGMENT AND USE THEREOF

This application claims priority to and the benefit of Chinese Patent Application No. 201510397770.9 filed on Jul. 7, 2015, which application is incorporated herein in its entirety.

TECHNICAL FIELD

Embodiments of the present disclosure relate to a composite white pigment, a photoresist material comprising the composite white pigment and use thereof.

BACKGROUND ART

A new generation of OGS (One Glass Solution) product is a new potential direction of capacitive screen development, which, when compared with G/G, spares one glass substrate and thereby reduces the cost, has a simpler structure and better light transmission, and is lighter and thinner. However, OGS has encountered problems in terms of appearance. OGS uses a photoresist frame material in the production of a white cover; as white light does not absorb light by itself, most of the light will be scattered by pigment particles (see FIG. 1); consequently, white photoresist is poor in shielding ability. In order to achieve the same optical effect as black photoresist, white photoresist must have a thickness of at least 20 μm, or an additional layer of black photoresist having a thickness of 1 to 2 μm has to be added, which would easily lead ITO or metal to break upon climbing, thereby affecting the product function. Therefore, OGS products using white photoresist are not yet available.

Upon making OGS with ordinary white photoresist, the thickness of the white photoresist has to be at least 20 μm or an additional layer of black photoresist having a thickness of 1 to 2 μm has to be added to achieve good shielding ability, which would easily lead ITO or metal to break upon climbing, thereby significantly affecting the product function.

SUMMARY

Embodiments of the present disclosure provide a composite white pigment, comprising particles, each of the particles comprising an inner core comprising a non-white pigment and an outer layer comprising a white pigment and coating the inner core.

Embodiments of the present disclosure also provides a method for preparing the composite white pigment, specifically comprising: wrapping a surface of an inner core comprising a non-white pigment with a white liquid pigment, which is then dried and ground to form the composite white pigment.

Embodiments of the present disclosure further provide use of the above composite white pigment and photoresist material in a frame material of a one glass solution (OGS). Specifically, embodiments of the present disclosure also provide use of the composite white pigment as a frame material of a one glass solution (OGS).

BRIEF DESCRIPTION OF THE DRAWINGS

In order to illustrate the technical solutions of the embodiments of the present disclosure more clearly, the drawings of the embodiments are simply described below. Apparently, the drawings described below relate to only some embodiments of the present disclosure and are not limitative of the present disclosure.

Figure 1:
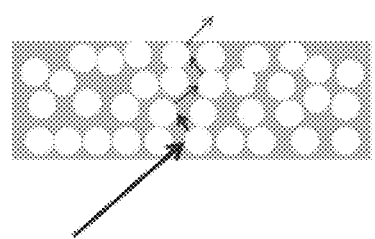
FIG. 1 is a schematic view of light absorption and reflection of a photoresist material.

In the figures, the arrows denote the direction in which the light is reflected.

DETAILED DESCRIPTION

To make clearer the objects, technical solutions and advantages of the embodiments of the present disclosure, a clear and full description of the technical solutions of the embodiments of the present disclosure will be made with reference to the accompanying drawings of the embodiments of the present disclosure. Obviously, the embodiments described are merely part of rather than all of the embodiments of the present disclosure. Based on the embodiments of the present disclosure described, all the other embodiments acquired by a person of ordinary skill in the art, without any creative labor, fall within the scope of protection of the present disclosure.

Embodiments of the present disclosure provide a composite white pigment, comprising particles, each of the particles comprising an inner core comprising a non-white pigment and an outer layer comprising a white pigment and coating the inner core.

In some embodiments, the inner core has a particle size in the range of 0.05 to 0.08 μm.

In some embodiments, the outer layer has a thickness of 0.01 to 0.025 μm.

In some embodiments, the non-white pigment is selected from a black pigment, a red pigment or a blue pigment.

In some embodiments, the composite white pigment is powdery.

In some embodiments, the particles have different shapes.

In some embodiments, the composite white pigment comprises spherical particles.

The present disclosure also provides a method for preparing the composite white pigment, specifically comprising: wrapping a surface of inner cores comprising a non-white pigment with a white liquid pigment, which is then dried and ground to form the composite white pigment.

In some embodiments, the white liquid pigment comprises a white pigment and a solvent.

In some embodiments, the inner cores have different shapes.

Further, the present disclosure provides a photoresist material comprising the above composite white pigment.

In some embodiments, the photoresist material comprises: 5 to 15 parts by weight of a photosensitizing agent, 5 to 15 parts by weight of a dispersant, 50 to 80 parts by weight of a solvent, and 5 to 15 parts by weight of the composite white pigment.

In some embodiments, the photoresist material comprises: 8 to 12 parts by weight of a photosensitizing agent, 8 to 12 parts by weight of a dispersant, 60 to 70 parts by weight of a solvent, from 6 to 12 parts by weight of composite white pigment.

In some embodiments, the composite white pigment in the photoresist material has particles of different shapes, or a white pigment having particles of irregular shapes are further added to the photoresist material comprising the composite white pigment having spherical particles.

In some embodiments, the particles of the composite white pigment in the photoresist material have different shapes.

In some embodiments, the particles of the composite white pigment are spherical, and the photoresist material further comprises white pigments having particles of irregular shapes.

Embodiments of the present disclosure further provide use of the above composite white pigment and photoresist material in a frame material of a one glass solution (OGS). Specifically, embodiments of the present disclosure also provide use of the composite white pigment as a frame material of a one glass solution (OGS).

In some embodiments, the photoresist material has a coating thickness of 2-3 μm as a frame material of OGS. In some embodiments, the composite white pigment is coated onto a OGS at a thickness of 2-3 μm as a frame material.

The composite white pigment provided in the embodiments of the present disclosure has a high optical density value (hereinafter also referred to as OD value), which is combined with a photosensitizing agent, a dispersant and a solvent to form a white photoresist material. Particles of the composite white pigment may increase the light absorption of the white photoresist, improve the light-shielding ability of photoresist, and make the color more uniform. While preparing OGS using the white photoresist with high light-shielding performance, several lithography processes of white photoresist can be saved and the OD value will be effectively increased as well.

The present disclosure provides a composite white pigment comprising particles, each of the particles comprising an inner core comprising a non-white pigment and an outer layer comprising a white pigment and coating the inner core.

The present disclosure improves the light absorption defects of a common pure white pigments by a non-white inner core through the composite structural design of the inner and outer layers having different colors, where the introduction of a composite white pigment helps to improve the light absorption performance of a traditional white photoresist material, may increase the light absorption of the white photoresist, improve the light-shielding ability of the photoresist, and make the color more uniform.

The inner core described herein may have various shapes, such as sphere, ellipsoid, etc., for example, sphere.

In some embodiments, the inner core has a particle size in the range of 0.05 to 0.08 μm, where the inner core with such size can further ensure the application effect of the composite white pigment in a photoresist material.

In some embodiments, the outer layer has a thickness of 0.01 to 0.025 μm. The outer layer with such thickness will not affect the light absorption performance of the outer layer of the white pigment or improvement of the inner core of the non-white pigment to the overall light absorption performance.

In some embodiments, the overall diameter of the core and the outer layer (i.e., the diameter of the composite white pigment or the diameter of the particles of the composite white pigment) is 0.075-0.1 μm.

In some embodiments, the non-white pigment is selected from a black pigment, a red pigment, a blue pigment and the like, for example, a black pigment. A combination of a pigment having the above specific color and a white pigment achieves better application effects.

The embodiments of the present disclosure also provide a method for preparing the composite white pigment, specifically comprising: wrapping a surface of inner cores comprising a non-white pigment with a white liquid pigment, which is then dried and ground to form the composite white pigment.

The specific preparation steps are known to a person skilled in the art, e.g., the non-white pigment particle groups are mechanically dispersed and isolated into isolated primary particles of a size, so that the entire surface of each particle is accessible, the above pigment particles are placed in a white liquid pigment to enable their surfaces to be wrapped by the white pigment, which are then dried to form composite pigment particles, and finally subjected to a conventional grinding and dispersing process for a pigment to obtain the composite white pigment as set forth in the present disclosure.

In some embodiments, the photoresist material comprises: 5 to 15 parts by weight of a photosensitizing agent, 5 to 15 parts by weight of a dispersant, 50 to 80 parts by weight of a solvent, and 5 to 15 parts by weight of the composite white pigment.

In some embodiments, the photoresist material comprises: 8 to 12 parts by weight of a photosensitizing agent, 8 to 12 parts by weight of a dispersant, 60 to 70 parts by weight of a solvent, and 6 to 12 parts by weight of the composite white pigment.

The unit of the above parts can be a weight unit, e.g., g, kg, etc.

With the above specific formulation, the application effect of the composite white pigment is especially significant, i.e., it can improve the light absorption of the white photoresist, thereby increasing the entire OD value of the material. The impact of a white photoresist with a large thickness on ITO and metal climbing breakage is avoided.

In addition, the composite white pigment in the photoresist material has particles of different shapes, or a white pigment having particles of irregular shapes are further added to the photoresist material comprising the composite white pigment having spherical particles.

That is, the shapes of the particles of the composite white pigments in the photoresist material may be consistent or inconsistent. When the shapes are consistent, sphere or ellipsoid (for example, sphere) may be consistently employed; when the shapes are inconsistent, a variety of composite white pigments having particles of different shapes (e.g., sphere, ellipsoid or other irregular shapes) can be simultaneously used for the preparation of a photoresist material, to increase the volume fraction of the composite white pigment in the photoresist material.

In some embodiments, the photoresist material comprises a combination of a plurality of composite white pigments having particles of different shapes, which can increase the volume fraction of the composite white pigment in the photoresist material, such that, for example, a frame material of a one glass solution (OGS) prepared thereby can improve the light absorption of the white photoresist, thereby increasing the entire OD value of the material.

Furthermore, as to the photoresist material of the present disclosure, when the shape of the particles of the composite white pigment is regular, white pigments having particles of irregular shapes can be further added to the photoresist material comprising the composite white pigment, to increase the volume fraction of pigment in the photoresist material, thereby improving the light-shielding ability of the photoresist material. The pigments having particles of irregular shapes herein can either be the composite white pigment (having particles of irregular shapes) as described in the present application or a common pure white pigment having particles of irregular shapes. In some embodiments, other common white pigment having particles of irregular shapes or a composite white pigment having particles of irregular shapes are further added to the photoresist material comprising a composite white pigment having spherical particles. A person skilled in the art may specifically select the types of the white pigment having particles of irregular shapes and determine the amount thereof in light of the actual requirement, and no particular limitation is made in the present disclosure.

In the present application, the photosensitizing agent, dispersant and solvent are all conventional components in a photoresist material, where a variety of known materials (e.g., acrylic resins may be used for dispersants) can be employed. A person skilled in the art will appreciate that, in a conventional photoresist material (for example, commercially available SBM-2213-R07, the model being Samyang black photoresist model), and the application effect can be significantly improved by merely replacing conventional white pigment with the composite white pigment of the present disclosure (without adjusting other components in the material).

Figure 2:
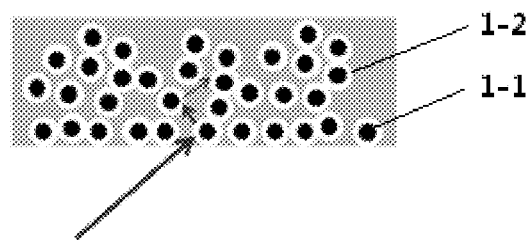
FIG. 2 is a schematic view of light absorption and reflection of a photoresist material according to an embodiment of the present disclosure.

FIG. 1 is a schematic view of light absorption and reflection of a photoresist material, where the photoresist material is a pure white pigment. FIG. 2 is a schematic view showing light absorption and reflection of a photoresist material comprising a composite white pigment according to an embodiment of the present disclosure. As shown in FIG. 2, the photoresist material comprising a composite white pigment according to an embodiment of the present disclosure can significantly improve the light absorption and reduce the light transmission. Compared with FIG. 1, it is known that one part of the light of the photoresist material comprising the composite white pigment is absorbed by the wrapped black pigment and the other part thereof is reflected, and after repeated paths, only a small part of light can pass through the surface, which significantly improves the light-shielding performance of the material.

The present disclosure also provides use of the above composite white pigment and photoresist material in an OGS frame material. The above photoresist material can be desirably used in a white OGS frame material (by a lithography process), which can not only save several lithography processes of white photoresist, but also effectively increase the OD value. When the photoresist material is used as a white OGS frame material, the thickness of the white photoresist can be significantly less than conventional 20 μm, for example, less than 15 μm, for example, less than 10 μm, for example, less than 5 μm.

In some embodiments, the photoresist material as an OGS frame material (process) is coated at a thickness of 2 to 3 μm, which thickness range can meet the requirement that the OD value is greater than 4. When used, the photoresist material is coated directly onto the OGS, which, after exposure and development, becomes a black or white frame of a mobile phone, computer or the like, where good light-shielding performance is required to prevent light leakage and prevent the wiring or modules at the frame from been seen from the front.

In the present application, by incorporating a composite white pigment into a common photoresist material, the OD value thereof can be significantly improved, where a common white photoresist of 1 μm thickness has an OD value of about 0.05; if the OD value is required to be >4, then a pure white photoresist with a thickness of 80+ μm is required. In addition, after actual detection, a 12 μm thickness common white photoresist has an OD value of 0.6, a 1.5 μm thickness black photoresist has an OD value of 4, and a 12 μm white +1.5 μm black photoresist has an OD value of about 6. As to the photoresist pigment of the present disclosure, owing to its particular composite white pigment structure, its OD value can be increased by 30 to 40 times; and when used as a white OGS frame material, the requirement that the OD value is greater than 4 can be met with a thickness of 2 to 3 μm, which not only saves coating processes and materials, but also avoids breakage problems in overlapping of other film layers caused by the photoresist being too thick.

The specific technical solution of the above 12 μm white +1.5 μm black photoresist is as follows: a 12 μm white photoresist material is first coated, after exposure and development, a 15 μm black photoresist is coated, which is further subjected to exposure and development, to form the final product frame. Said process requires the process of coating—exposure—development to be carried out for at least two times.

The technical solution of the present disclosure will be described in detail referring to specific embodiments.

Embodiment 1

The present embodiment provides a composite white pigment (having spherical particles), comprising an inner core 1-1 comprising a black pigment, and an outer layer 1-2 comprising a white pigment and coating the inner core 1-1.

As shown in FIG. 2, after the composite white pigment obtained in the present embodiment is used for a photoresist material, since the composite white pigment is used, light absorption of the photoresist material can be significantly improved and the light transmission can be reduced. Compared with FIG. 1, it is known that one part of the light to pass through the composite white pigment is absorbed by the wrapped black pigment and the other part thereof is reflected, and after repeated paths, only a small part of light can pass through the surface, which significantly improves the light-shielding performance of the material.

Embodiment 2

The present embodiment provides a composite white material, which differs from Embodiment 1 merely in that: in the present embodiment, the inner core 1-1 has a particle size of 0.08 μm, and the outer layer 1-2 has a thickness of 0.02 μm.

Embodiment 3

The present embodiment provides a composite white material, which differs from Embodiments 1 and 2 merely in that: in the present embodiment, the inner core 1-1 is formed from a blue pigment, the inner core 1-1 has a particle size of 0.05 μm, and the outer layer 1-2 has a thickness of 0.025 μm.

Embodiment 4

The present embodiment provides a composite white material, which differs from Embodiments 1 and 2 merely in that: in the present embodiment, the inner core 1-1 is formed from a red pigment, the inner core 1-1 has a particle size of 0.07 μm, and the outer layer 1-2 has a thickness of 0.01 μm.

Embodiment 5

The present embodiment provides a method for preparing the composite white material according to nay of the above Embodiments 1-4, specifically comprising:

(1) forming an inner core with a non-white (e.g., black, blue or red) pigment by a conventional method; and (2) placing the above inner core (a non-white pigment particle) in a white liquid pigment so that a surface of the inner core is wrapped by a white pigment, which is then dried to form a composite pigment particle, and subjected to a conventional process of grinding and dispersing process for a pigment, to obtain the composite white pigment.

Embodiment 6

The present embodiment provides a photoresist material, which is prepared according to the commercially available SBM-2213-R07 (the model being Samyang black photoresist model), except that the black pigment therein is replaced by the composite white pigment obtained in Embodiment 2 of the present disclosure (prepared by the method as described in Embodiment 5) in a proportion of 1:1.

Embodiment 7

The present embodiment provides a photoresist material, which comprises the following components: 10 parts by weight of a photosensitizing agent, 10 parts by weight of a dispersant, 60 parts by weight of a solvent, and 10 parts by weight of the composite white pigment according to Embodiment 1.

Embodiment 8

The present embodiment provides a photoresist material, which differs from Embodiment 7 merely in that: the photoresist material in the present embodiment comprises the following components: 8 parts by weight of a photosensitizing agent, 8 parts by weight of a dispersant, 60 parts by weight of a solvent, and 6 parts by weight of the composite white pigment according to Embodiment 2.

Embodiment 9

The present embodiment provides a photoresist material, which differs from Embodiment 7 merely in that: the photoresist material in the present embodiment comprises the following components: 12 parts by weight of a photosensitizing agent, 12 parts by weight of a dispersant, 70 parts by weight of a solvent, and 12 parts by weight of the composite white pigment according to Embodiment 3.

Embodiment 10

The present embodiment provides a photoresist material, which differs from Embodiment 7 merely in that: the photoresist material in the present embodiment comprises the following components: 5 parts by weight of a photosensitizing agent, 5 parts by weight of a dispersant, 50 parts by weight of a solvent, and 5 parts by weight of the composite white pigment according to Embodiment 3.

Embodiment 11

The present embodiment provides a photoresist material, which differs from Embodiment 7 merely in that: the photoresist material in the present embodiment comprises the following components: 15 parts by weight of a photosensitizing agent, 15 parts by weight of a dispersant, 80 parts by weight of a solvent, and 15 by weight parts of the composite white pigment according to Embodiment 2.

Embodiment 12

The present embodiment provides a photoresist material, which differs from Embodiment 7 merely in that: common white pigment particles of irregular shapes or irregular composite white pigments obtained by the method of Embodiment 5 are further added to the photoresist material of the present embodiment.

Embodiment 13

The present embodiment provides use of the photoresist material according to any one of Embodiments 6-12 in an OGS frame material, where the specific application method comprises: using the photoresist material as an OGS frame material with a coating thickness of 2-3 μm (i.e., forming a frame material with a thickness of 2-3 μm). After testing, the frame material has an OD value of greater than 4.

The above are merely exemplary embodiments of the present disclosure, and are not intended to limit the scope of protection of the present disclosure, which is yet determined by the appended claims.

The present application claims the priority of the Chinese patent application No. 201510397770.9 submitted on Jul. 7, 2015, and the content disclosed in the above Chinese patent application is incorporated herein by reference as part of the present application.

The invention claimed is:

1. A photoresist material, comprising a composite white pigment, wherein the composite white pigment comprises particles, each of the particles comprising:
   an inner core comprising a non-white pigment, and
   an outer layer comprising a white pigment and coating the inner core, wherein the inner core has a particle size in a range of 0.05 to 0.08 um.

2. The photoresist material according to claim 1, wherein the outer layer has a thickness of 0.01 to 0.025 μm.

3. The photoresist material according to claim 1, wherein the non-white pigment is selected from a black pigment, a red pigment or a blue pigment.

4. The photoresist material according to claim 1, wherein the composite white pigment is powdery.

5. The photoresist material according to claim 1, wherein the particles have different shapes.

6. The photoresist material according to claim 1, comprising: 5 to 15 parts by weight of a photosensitizing agent, 5 to 15 parts by weight of a dispersant, 50 to 80 parts by weight of a solvent, and 5 to 15 parts by weight of the composite white pigment.

7. The photoresist material according to claim 6, comprising: 8 to 12 parts by weight of a photosensitizing agent, 8 to 12 parts by weight of a dispersant, 60 to 70 parts by weight of a solvent, and 6 to 12 parts by weight of the composite white pigment.

8. The photoresist material according to claim 1, wherein:
   the particles of the composite white pigment in the photoresist material have different shapes, or
   the particles of the composite white pigment are spherical, and the photoresist material further comprises a white pigment having particles of irregular shapes.

9. A method of using the photoresist material according to claim 1 as a frame material of a one glass solution (OGS), comprising: coating the photoresist material onto the OGS as a frame material at a thickness of 2-3 μm.

10. A method of using a composite white pigment as a frame material of a one glass solution (OGS), comprising: coating the composite white pigment onto the OGS as a frame material at a thickness of 2-3 μm, wherein the composite white pigment comprises particles, each of the particles comprising:
   an inner core comprising a non-white pigment, and
   an outer layer comprising a white pigment and coating the inner core.

* * * * *